United States Patent [19]

Grah et al.

[11] Patent Number: 4,947,787
[45] Date of Patent: Aug. 14, 1990

[54] APPARATUS FOR THE ELECTROSTATIC LACQUERING OF PRINTING CIRCUIT BOARDS

[76] Inventors: Klaus Grah, Klingenstr. 70a, D-5650 Solingen 1; Günter Korsten, Richrather Str. 206, D-4010 Hilden; Werner Schauf, Melanchthonstr. 43, D-5650 Solingen 1, all of Fed. Rep. of Germany

[21] Appl. No.: 392,817

[22] Filed: Aug. 10, 1989

Related U.S. Application Data

[62] Division of Ser. No. 260,147, Oct. 20, 1988, Pat. No. 4,900,580.

[30] Foreign Application Priority Data

Oct. 22, 1987 [DE] Fed. Rep. of Germany ....... 3735798
Jun. 24, 1988 [DE] Fed. Rep. of Germany ....... 3821278

[51] Int. Cl.$^5$ ................................................ B05C 5/00
[52] U.S. Cl. ........................................ 118/64; 118/66; 118/314; 118/322; 118/324
[58] Field of Search .................... 118/630, 632, 66, 64, 118/314, 322, 324

[56] References Cited

U.S. PATENT DOCUMENTS

| | | | |
|---|---|---|---|
| 2,039,776 | 5/1936 | Caton | 427/209 X |
| 2,051,813 | 8/1936 | Bellamy | 427/209 X |
| 2,741,218 | 4/1956 | Miller | 118/632 |
| 2,780,565 | 2/1957 | Juvinall | 118/314 X |
| 4,002,143 | 1/1977 | Dover | 118/314 |
| 4,454,003 | 6/1984 | Fishman et al. | 118/314 X |
| 4,513,682 | 4/1985 | Otocki | 118/322 |
| 4,867,099 | 9/1989 | Heine et al. | 118/630 |

*Primary Examiner*—Bernard Nozick
*Attorney, Agent, or Firm*—Sprung Horn Kramer & Woods

[57] ABSTRACT

The invention relates to an apparatus for the electrostatic lacquering of printed circuit boards formed with continuous holes as soldering places for connecting wires. The characterizing feature of the apparatus is that the printed circuit boards, continuously conveyed in a suspended position, are lacquered on one side, then turned over, lacquered on the other side, and the two layers of lacquer are then immediately dried simultaneously.

6 Claims, 6 Drawing Sheets

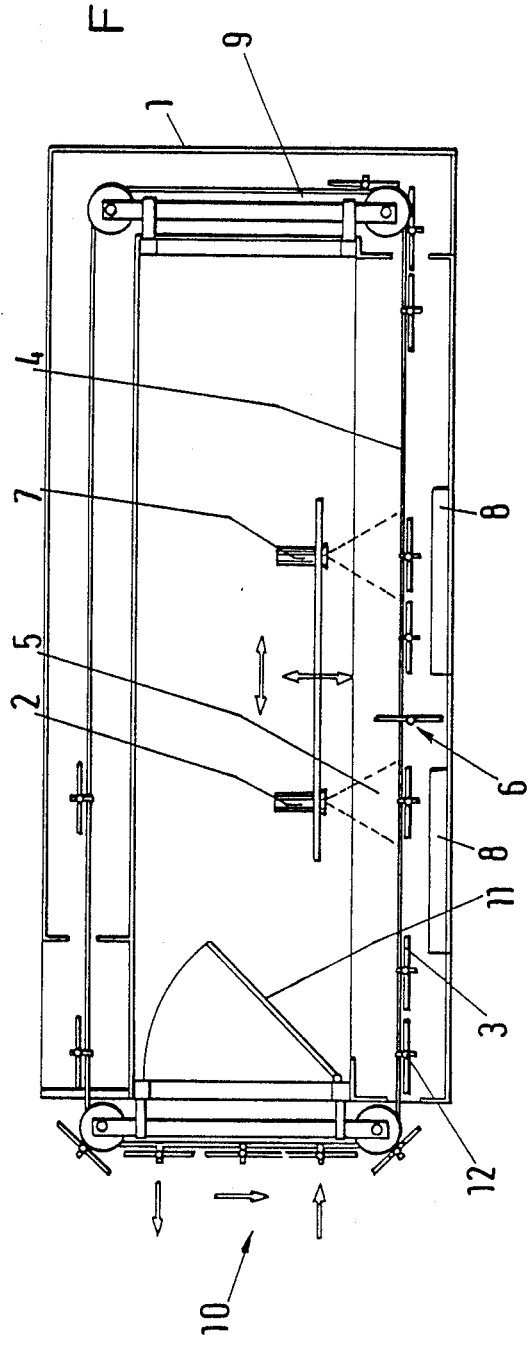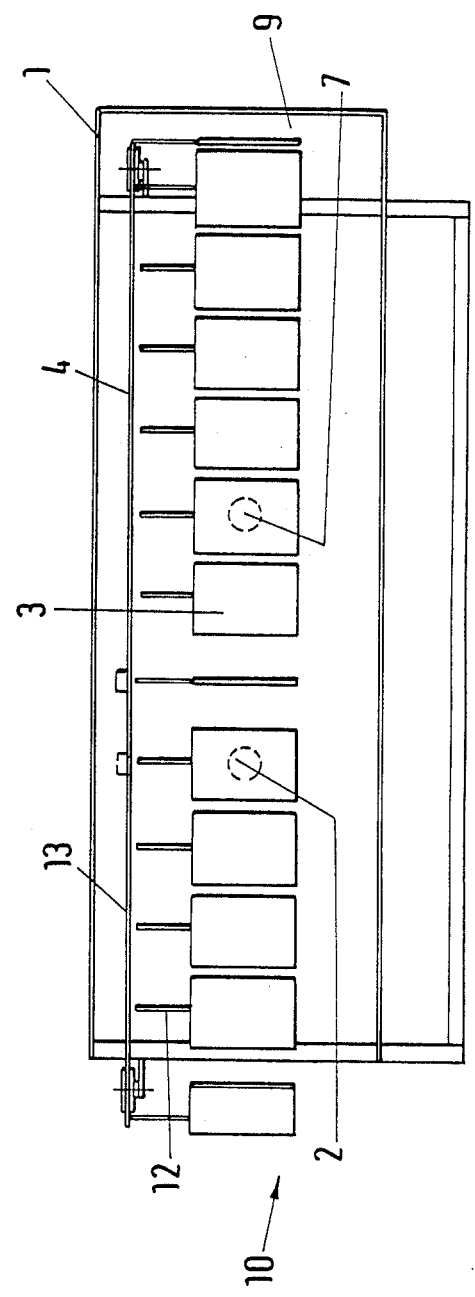

APPARATUS FOR THE ELECTROSTATIC LACQUERING OF PRINTING CIRCUIT BOARDS

This is a division of application Ser. No. 07/260,147, filed Oct. 20, 1988, now U.S. Pat. No. 4,900,580.

FIELD OF THE INVENTION

The invention relates to a process and an apparatus for the electrostatic lacquering of printed circuit boards formed with continuos holes as soldering places for connecting wires.

BACKGROUND OF THE INVENTION

Printed circuit boards comprise a board of plastics, for example, epoxy resin, which is copper lined on both sides and into which the tracks and connecting places are etched. Thin plastics coatings are applied by various known process for the insulation of the printed circuit boards. The prior art lacquering process include application by a squeegee, immersion, spraying and also electrostatic coating. The electrostatic lacquering of printed circuit boards is described in detail in German OS 1 772 976. High voltage is generated between a spraying head and the printed circuit board to be lacquered, the board being applied to ground potential. Due to the high electric potential between the rotating spraying head and the printed circuit board, lacquer droplets are conveyed to the printed circuit board surface adjacent the spraying head and melt on such surface to produce a lacquer film.

In the practical operation of electrostatic lacquer coating installations of the kind specified the printed circuit boards were moved lying flat and horizontal on paper past the lacquering station. After the lacquering layer had dried, the printed circuit board was turned and its major surface coated in the same manner, the major surface then also having to be dried. A disadvantage of that process is that it is expensive in time and money to perform lacquering and drying twice. Another disadvantage is that the lacquer layer applied first must be dried twice, namely for the first time when it is itself dried, and for the second time when the lacquer layer of the opposite surface is dried. As a result there is a different consistency in the two lacquered layers on the two surfaces of the printed circuit boards. The lacquer layer first applied may even become damaged during the drying of the second lacquer layer, so that the printed circuit board becomes unusable.

German OS 33 04 648 discloses a process for the electrostatic application of a lacquer film to magnetic tapes, wherein the lacquer dispersion is applied electrostatically to both surfaces of the tape simultaneously, whereafter the two lacquer layers are dried simultaneously. However, this prior art process, which uses oppositely disposed spraying nozzles, can be applied only to the coating of continuous tapes; during the coating of items such as printed circuit boards, guided at intervals past the spraying nozzles, in the intervals between successive items to be coated the sprayed streams from the opposite nozzles would impinge on one another and eddy uncontrollably, such disturbances preventing the obtaining of a clearly-defined layer thickness. It also calls for a relatively large amount of space to dispose the spraying nozzles on both sides of the tape, as in the case of the process disclosed in German OS 33 304 648.

SUMMARY OF THE INVENTION

It is an object of the invention to provide a process and apparatus enabling qualitatively satisfactory lacquering to be performed quickly and inexpensively. The associated apparatus occupies only a small amount of space.

To this end according to the invention the printed circuit boards, continuously conveyed in a suspended position, are lacquered on one side, then turned over, lacquered on the other side, and the two layers of lacquer are then immediately dried simultaneously. The difference from the prior art procedure is therefore that the printed circuit boards are lacquered on both sides in immediate succession, the printed circuit boards being turned over between the application of the lacquer to one surface and the other, while the printed circuit boards are continuously moved on by a conveying system from the first lacquering station to the turning station and from the latter to the second lacquering station and the drying oven.

The process according to the invention combines the advantage of rapid, inexpensive coating with that of uniformly satisfactory quality of the lacquer layers on both sides of the printed circuit board. The turning over of the printed circuit boards prior to the application of the second lacquer layer also enables the lacquering stations to be disposed ina space-saving manner on the same side of the conveying system, so that only a relatively small chamber is required to receive the lacquering stations of the turning station and the drying furnace, so that such chamber can be constructed for conveyance in containers.

During lacquering and drying the suspended printed circuit boards are conveyed by an endless belt or chain, while the operations of suspending the printed circuit boards to be coated and unhooking the coated printed circuit boards from the conveying system can be performed at one place.

The invention also provides an apparatus for the electrostatic lacquering of printed circuit boards having: a lacquering station; a drying oven inside a substantially dust-free chamber; and a conveying system which conveys the printed circuit boards past the lacquering station, through the oven, and out of the chamber, the apparatus being characterized by a first lacquering station, a turning station which follows in the conveying direction and is itself followed by a second lacquering station immediately upstream of the inlet opening of the drying furnace, which follows in the conveying direction. The endless chain, preferably rotating in a horizontal plane, can be fitted with rods on the grid module given by the length of the chain links, the rods being inserted through the chain links, which are constructed in the form of hollow rivets. The bottoms of the rods have hooks for suspending the printed circuit boards extending vertically. Just like the endless chain, the heads of the rods are guided in rails and turned through 180° by suitable means at the turning station. To this end in one embodiment the heads of the rods can be constructed, for example, in the form of pinions engaging at the turning station with a rack which entrains the pinions through half a rotation.

However, the heads of the rods can also take the form of crossheads in whose conveying path stops are disposed which rotate the heads and the rods and also the printed circuit boards suspended therefrom through 180°.

In the prior art electrostatic lacquering apparatuses the problem arises of intercepting and removing the lacquer residues which do not reach the surface of the articles to be coated. In the prior art lacquering installations the lacquer residues are intercepted either in a filter upstream of the suctional removal opposite the spraying nozzle, or else the residues drop on to a paper which is slowly moved past below the lacquering station, intercepts the lacquer residues and is subsequently rolled up. In the first-mentioned process the suctional removal effectively prevents the lacquer residues from being sprayed around to greater distances, but the filter very quickly becomes clogged and must be interchanged about every 2 hours. Both the processes also suffer from the disadvantage that the filters or intercepting paper web must be disposed of as special wastes. Another disadvantage is that the known apparatuses are unable to economically so intercept the lacquer residues that they can be reused.

It is therefore a further object of the invention to obviate the aforementioned disadvantages of prior art electrostatic lacquering devices and to provide a suctional removal box in which the filter does not become clogged so quickly, thereby extending the service life of the filter and reducing the disposal problem, and which also enables the majority of the lacquer residues to be supplied for further use.

The essential characterizing feature of the suctional removal box according to the invention is the closed metal plate which covers over its whole surface the suction side of the suctional removal box and, due to its distance from the suction side of the suctional removal box, gives access to the suction side only laterally. On impingement, the air impinging with the lacquer residue droplets on the metal plate separates the majority of the entrained lacquer residue and then flows around the edges of the metal plate through the filter and into the suctional removal box. The last droplets of lacquer residue are intercepted in the filter paper upstream of the suction surface of the suctional removal box. If the metal plate is disposed vertically, the lacquer residue droplets remaining sticking to the metal plate either run down the metal plate and pass via a channel disposed or shaped on the bottom edge of the metal plate into an intercepting tank, or they remain sticking to the metal plate and are subsequently knocked off the metal plate when the lacquering apparatus is stopped at the end of the shift. In both cases the majority of the lacquer resideu can be intercepted for recycling.

The filter on the suction side of the suctional removal box is also protected by the preferred embodiment of the suctional removal box, wherein the metal plate has edges bent through about 90° in the direction of the suctional removal box. By its bent edges the metal plate covers the distance from the suctional removal box and prevents air charged with lacquer residue droplets from flowing against the filter. Due to the forced deflection of the air stream by the bent edges of the metal plate, any lacquer residue droplets entrained by the air are deposited at the suctional removal box before the air reaches the filter.

The metal plate can be particularly simply attached upstream of the suction side of the suctional removal box by being attached thereto by means of permanent magnets, the length of which at the same time determines the distance of the metal plate upstream of the suctional removal box.

As already mentioned, the suctional removal box can be disposed with the suction side standing vertically and the metal plate in front, but the suction side of the suctional removal box can also readily be laid horizontal. In both cases the advantages described are obtained.

DESCRIPTION OF THE DRAWINGS

The invention will now be described in greater detail with reference to the drawings, wherein:

FIG. 1 shows the apparatus in plan view, and

FIG. 2 is a side elevation of the apparatus,

DETAILED DESCRIPTIONS OF THE DRAWINGS

Figure 3:
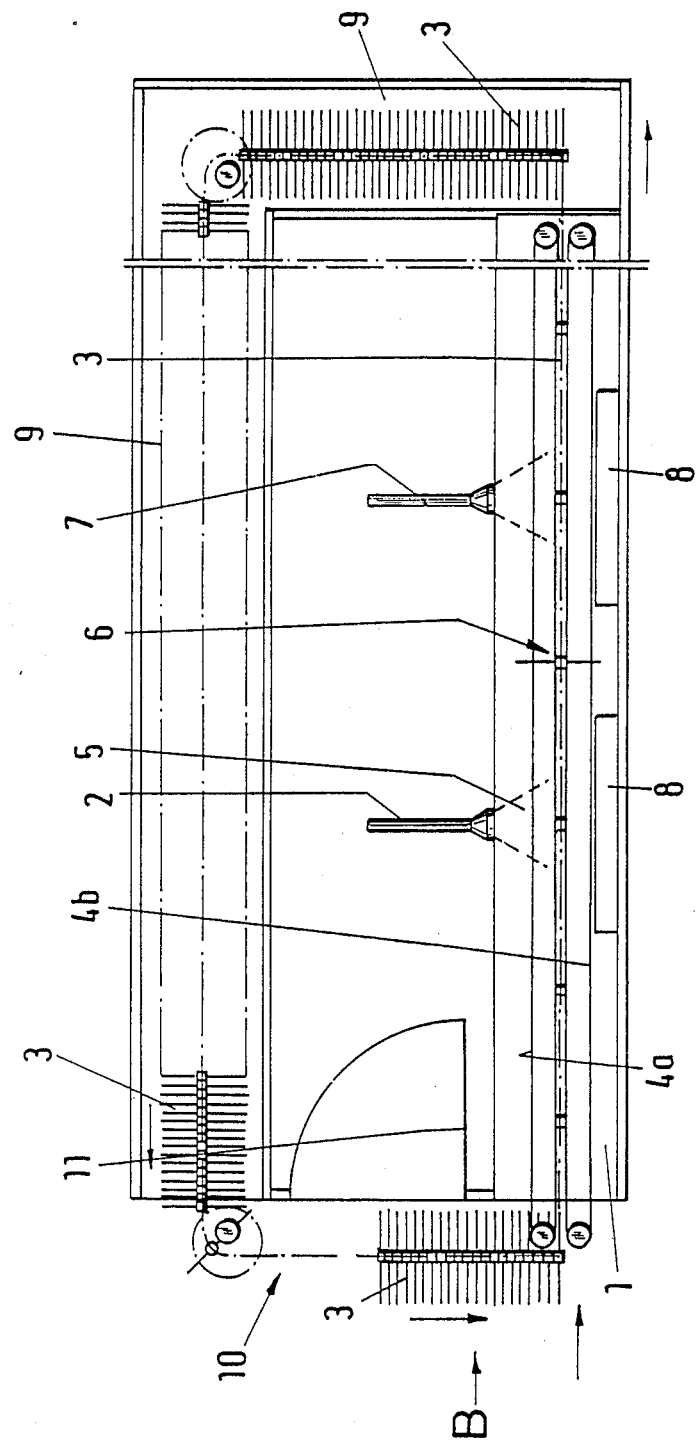
FIG. 3 shows the apparatus with an amended transport and storing system circuit boards to be lacquered

A substantially dust-free chamber 1 contains a first lacquering station 2 for the electrostatic lacquering of one side of printed circuit boards 3 which are moved through the chamber 1 at a uniform speed suspended vertically from an endless chain 4 or belt.

After the printed circuit board 3 disposed in the spraying position has left the spraying nozzle 5 of the first lacquering station 2, it arrives at a turning station 6, at which the printed circuit board 3 is turned—i.e., turned through 180° around a vertical axis. Then the turned-over printed circuit board 3 moves into the zone of action of a second lacquering station 7 by which the other side of the printed circuit board is coated with a lacquer film. Disposed downstream of each lacquering station 2, 7 is a suctional removal device 8 being explained in detail below.

After leaving the second lacquering station 7, the printed circuit board 3, now electrostatically coated with a lacquer film on both sides, moves into a drying oven 9 which occupies the rear wall of the chamber 1 and the side opposite the lacquering stations 2, 7. Both lacquer layers on the surface of the printed circuit boards 3 are dried simultaneously in the drying oven 9.

After leaving the drying oven 9, the printed circuit boards 3, still suspended from the endless chain 4 or belt, move to a place 10 outside the chamber 1, at which servicing can be performed—i.e., at the place 10 coated printed circuit boards 3 can be removed from the conveying system and fresh printed circuit boards 3 for coating can be suspended for conveying through the chamber 1.

The chamber 1 is closed off in a substantially dust-free manner by a door 11, through which the interior of the chamber 1 is accessible.

Figure 5:
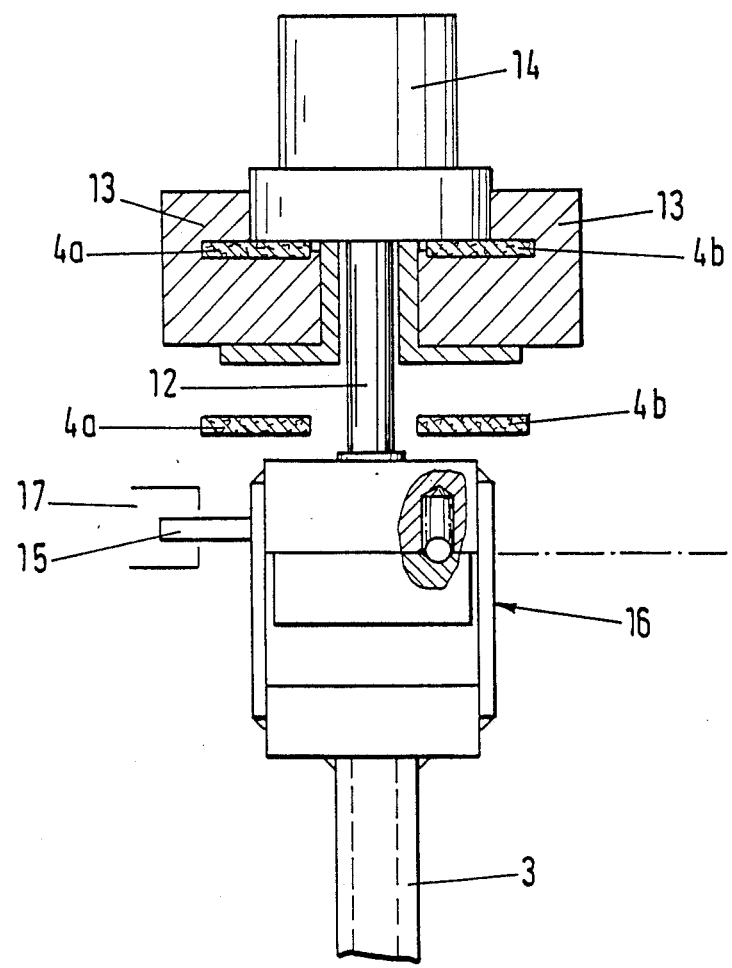
FIG. 5 shows a head for transporting the plates in hanging position on transport means.

As shown most clearly in FIGS. 2 and 5, the printed circuit boards 3 are suspended each from a rod 12 inserted downwardly through the links of the chain 4, which are constructed in the form of hollow rivets, or the rods 12 being guided by their heads 14 in rails 13 and transported on and between two parallel arranged endless belts 4a, 4b (FIG. 3). Means enable the printed circuit boards 3 suspended from the rods to be turned over at the turning station 6, f,i, a lever 15 connected to the turning mechanism 16 between rod 12 and circuit board 3 which runs against a stopper 17 being arranged in the path of the level 15 in the turning station 6.

The apparatus of FIG. 1 can also have another transport system as can be seen from FIG. 3. The circuit boards 3 are conveyed through the chamber 1 in a way similar to that illustrated in FIG. 1. However, when conveyed through the drying furnace, the circuit boards 3 have a position perpendicular to that shown in FIG. 1. Thus the capacity of the drying furnace is greatly enlarged and the remaining time of the circuit boards 3 in the drying furnace can be extended if separate conveying means are arranged in the chamber 1 and in the drying furnace. The transportation speed in the drying furnace and in the spraying chamber 1 can then be different.

Before the entrance to the chamber 1 circuit boards 3 to be lacquered are successively mounted to the rod 12 by means of which the circuit boards 3 are hung up in a buffer in the position B at the front of the apparatus. From this buffer the circuit boards 3 are successively pushed onto the endless chain 4 (FIG. 1) or an endless belt arrangement comprising two parallel extending endless belts 4a, 4b (FIG. 3).

Figure 4:
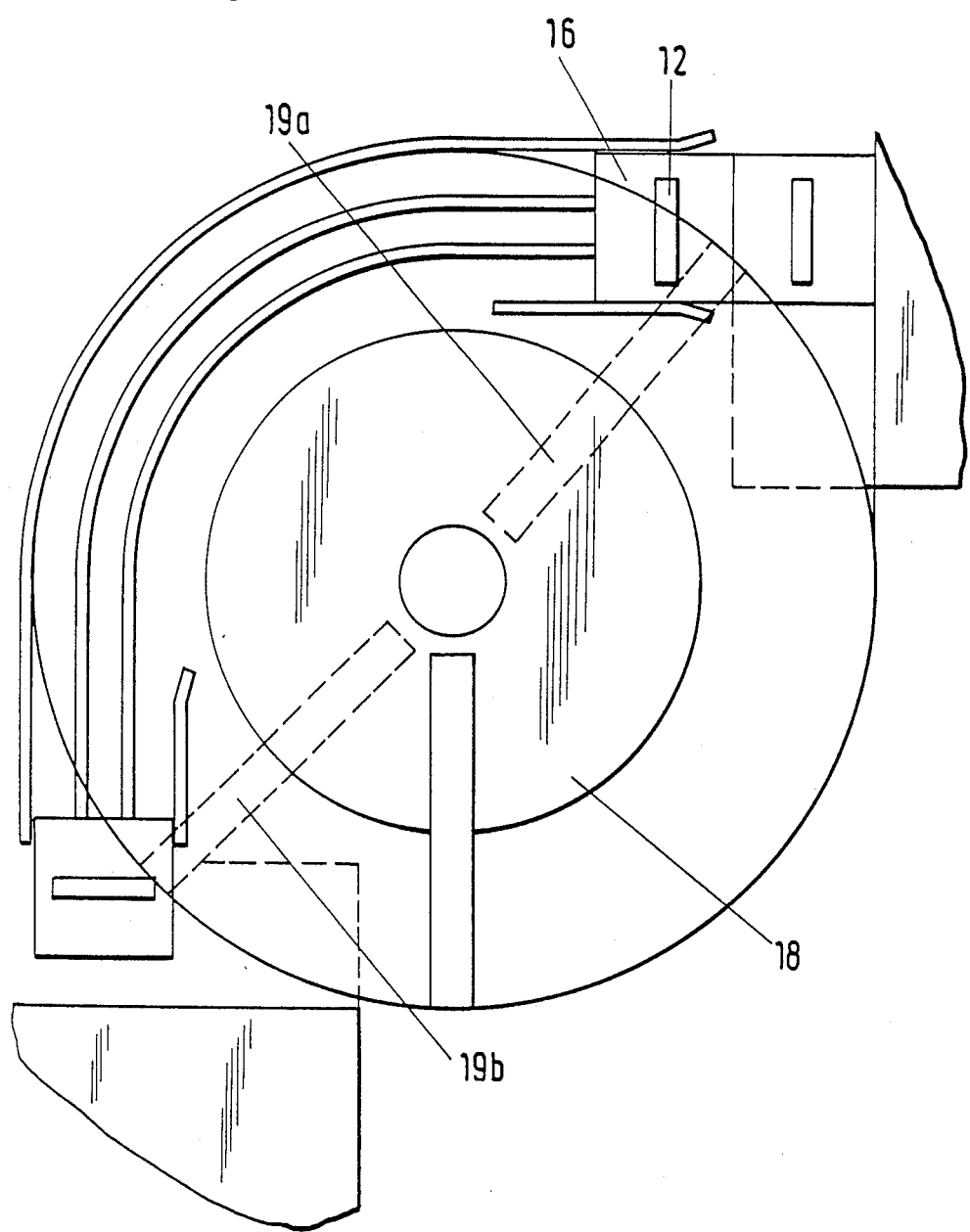
FIG. 4 shows a curved transport rail for conducting the plates.

At the corner of the drying furnace 9 and at the exit of the furnace turning discs 18 are arranged by means of which the hanging circuit board are conveyed cyclically from one conveying mechanism to the other as can be seen best from FIG. 4. One cycle is the time for a half turn of the disc 18. One arm 19a on the disc 18 abuts against rod 12 and the opposite arm 19b releases the peceding circuit board 3.

Figure 6:
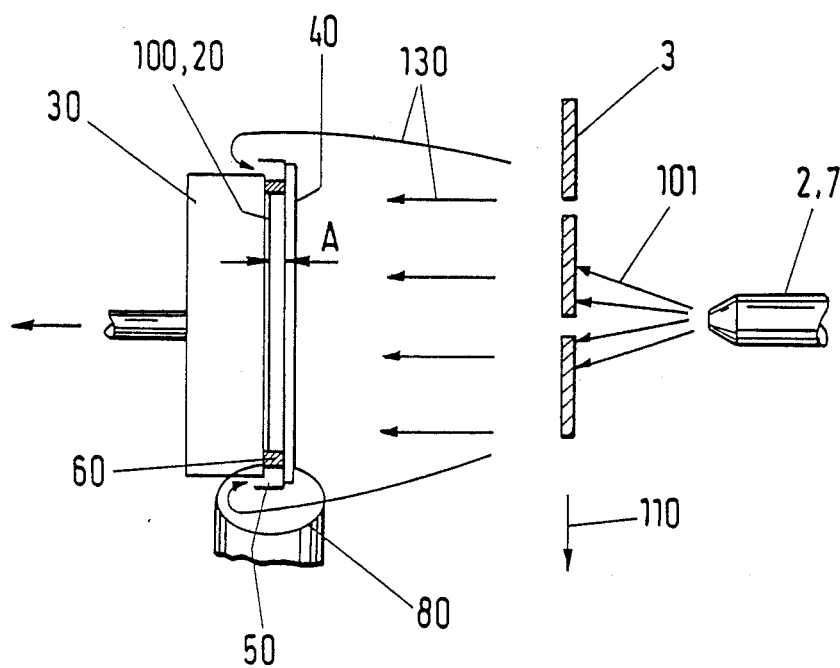
FIG. 6 is a diagrammatic plan view of a spraying apparatus with suctional removal box.

As shown in FIG. 6, lacquer is sprayed in the direction indicated by arrow 101 from a spraying nozzles 2,7 on to the circuit boards 3 successively moved past the nozzles 2,7 in the direction indicated by arrow 110. The air flow (arrow 130) charged with lacquer residue droplets then passes to the metal plate 40, where it unloads the majority of such droplets. Only a very small proportion of lacquer residue then flows around the edges 50 of the metal plate 40 and passes to the filter paper 100 upstream of the perforate sheet 20 on the suction side of the suctional removal box 30 As a result, the filter paper 100 becomes clogged with lacquer residues only after a very much longer time. The majority of the lacquer residues is intercepted in the tank 80 or knocked or scratched off the metal plate 40 for further use.

The distance A at which the metal plate 40 is disposed upstream of the filter paper 100 should be in the range of centimeters and can be about 2 to 4 cm in length.

Figure 7:
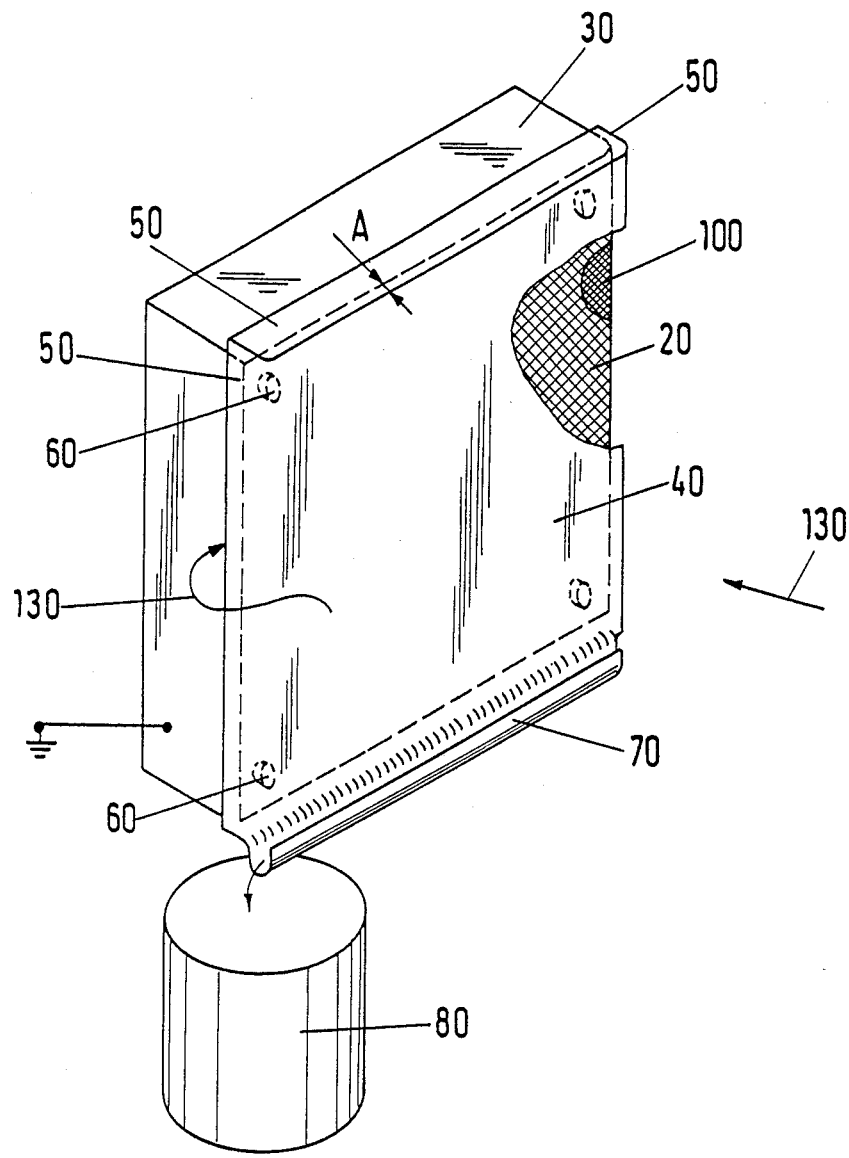
FIG. 7 is a perspective view of the suctional removal box according to the invention for electrostatic lacquering devices.

A closed metal plate 40 is disposed by its whole surface on the suction side of a suctional removal box 60 at a distance A upstream of a perforate plate 200 covered with filter paper 100. The edges 50 of the metal plate 40 are bent through 90° in the direction of the suctional removal box 30 and cover the distance A between the metal plate 40 and the suction side of the suctional removal box. The metal plate 40 is attached to the suctional removal box 30 by permanent magnets 60. When the suctional removal box 30 and the metal plate 40 are disposed vertically (FIG. 7), the lower edge of the metal plate 40 has disposed or shaped thereon a channel 70 which intercepts the lacquer residues dripping from the metal plate 40 and conveys them to a collecting tank 80.

We claim:

1. An apparatus for the lacquering of printed circuit boards having: a lacquering station; a drying oven inside a substantially dust-free chamber; and a conveying system which conveys the printed circuit boards past the lacquering station, through the oven, and out of the chamber, wherein a turning station (6) for the printed circuit boards (3) suspended from the conveying system (4), and a second lacquering station (7) are disposed downstream of the first lacquering station (2) and immediately upstream of the inlet opening of the drying oven (9).

2. An apparatus according to claim 1, wherein the conveying system (4) is an endless chain which rotates in a horizontal plane and in which rods (12) having hooks for the suspension of the printed circuit boards (3) are inserted in the vertical position in the grid module given by the length of the chain links, the head of the rods (12) being guided in rails (13) in the course of which a turning station (6) is formed at which means are provided for rotating the heads of the rods (12).

3. An apparatus according to claim 1 wherein a closed metal plate is disposed over the whole surface on the suction side of a suctional removal box, at a small distance upstream of a perforated sheet covered with filter paper.

4. An apparatus according to claim 3 wherein the metal plate has edges bent through about 90° in the direction of the suctional removal box.

5. An apparatus according to claim 3 wherein the metal plate is retained at a distance upstream of the suction side by magnets on the suctional removal box.

6. An apparatus according to claim 3 wherein a channel is disposed or shaped along a lower edge of the metal plate.

* * * * *